(12) United States Patent
Reusch et al.

(10) Patent No.: US 9,935,295 B2
(45) Date of Patent: Apr. 3, 2018

(54) ORGANIC LIGHT-EMITTING COMPONENT AND METHOD FOR PRODUCING AN ORGANIC LIGHT-EMITTING COMPONENT

(71) Applicant: OSRAM OLED GmbH, Regensburg (DE)

(72) Inventors: Thilo Reusch, Donaustauf (DE); Daniel Steffen Setz, Boeblingen (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 14/398,098

(22) PCT Filed: Apr. 26, 2013

(86) PCT No.: PCT/EP2013/058759
§ 371 (c)(1),
(2) Date: Oct. 30, 2014

(87) PCT Pub. No.: WO2013/164271
PCT Pub. Date: Nov. 7, 2013

(65) Prior Publication Data
US 2015/0123093 A1 May 7, 2015

(30) Foreign Application Priority Data
Apr. 30, 2012 (DE) .................. 10 2012 207 151

(51) Int. Cl.
*H01L 51/00* (2006.01)
*C09K 11/06* (2006.01)
(Continued)

(52) U.S. Cl.
CPC ........ *H01L 51/5275* (2013.01); *H01L 51/007* (2013.01); *H01L 51/0059* (2013.01);
(Continued)

(58) Field of Classification Search
None
See application file for complete search history.

(56) References Cited

U.S. PATENT DOCUMENTS 7,781,961 B2 8/2010 Birnstock et al.
8,022,619 B2 9/2011 Birnstock et al.
(Continued)

FOREIGN PATENT DOCUMENTS

DE 10215210 A1 10/2003
DE 102004020245 A1 12/2005
(Continued)

OTHER PUBLICATIONS

Sun, Y., et al., "Enhanced light out-coupling of organic light-emitting devices using embedded low-index grids," Nature Photonics, vol. 2, Jul. 11, 2008, pp. 483-487.

*Primary Examiner* — Seahvosh Nikmanesh
*Assistant Examiner* — Xiaoming Liu
(74) *Attorney, Agent, or Firm* — Slater Matsil, LLP

(57) ABSTRACT

According to at least one embodiment, an organic light-emitting component includes a substrate, a first electrode arranged on the substrate, and a second electrode. An organic light-generating layer stack is arranged between the first and second electrodes and includes a first organic OLED functional material. A first organic coupling-out layer is in optical contact with the organic light-generating layer stack and includes an organic material containing a second organic OLED functional material. One of the first and second electrodes is translucent, and the first organic coupling-out layer is arranged on that side of the electrode that faces away from the organic light-generating layer stack.

11 Claims, 5 Drawing Sheets

(51) Int. Cl.
  *H01L 51/52*  (2006.01)
  *H01L 51/56*  (2006.01)
(52) U.S. Cl.
  CPC ...... *H01L 51/0067* (2013.01); *H01L 51/0072* (2013.01); *H01L 51/0081* (2013.01); *H01L 51/5253* (2013.01); *H01L 51/56* (2013.01); *H01L 2051/0063* (2013.01); *H01L 2251/5369* (2013.01)

(56) References Cited

U.S. PATENT DOCUMENTS

| | | | |
|---|---|---|---|
| 8,618,729 B2 | 12/2013 | Frischeisen et al. | |
| 9,343,683 B2 | 5/2016 | Becker et al. | |
| 2002/0098668 A1* | 7/2002 | Kim et al. | 438/584 |
| 2007/0114520 A1* | 5/2007 | Garditz | B82Y 20/00 257/40 |
| 2007/0164278 A1* | 7/2007 | Lee | H01L 51/5036 257/40 |
| 2007/0231604 A1* | 10/2007 | Ohkubo | C08G 61/122 428/704 |
| 2007/0241668 A1 | 10/2007 | Ottermann et al. | |
| 2007/0257608 A1 | 11/2007 | Tyan et al. | |
| 2008/0164807 A1 | 7/2008 | Hofmann et al. | |
| 2009/0051271 A1* | 2/2009 | Birnstock | H01L 51/5262 313/504 |
| 2011/0127491 A1 | 6/2011 | Jung | H01L 33/14 257/13 |
| 2011/0151173 A1 | 6/2011 | Ramadas et al. | |
| 2011/0267789 A1* | 11/2011 | Chew | H01L 21/4832 361/767 |
| 2011/0309307 A1 | 12/2011 | Zeika et al. | |
| 2012/0003448 A1* | 1/2012 | Weigel | B32B 17/10018 428/212 |
| 2012/0155093 A1* | 6/2012 | Yamada | H01L 51/5275 362/311.01 |
| 2012/0292604 A1* | 11/2012 | Lee | H05B 33/10 257/40 |
| 2013/0240847 A1* | 9/2013 | Zakhidov | H01L 27/3202 257/40 |
| 2015/0041780 A1* | 2/2015 | Ma | H01L 51/0072 257/40 |

FOREIGN PATENT DOCUMENTS

| | | |
|---|---|---|
| DE | 102004041371 A1 | 3/2006 |
| DE | 102004042461 A1 | 3/2006 |
| DE | 102004035965 B4 | 7/2007 |
| DE | 102008048161 A1 | 6/2010 |
| DE | 102006000993 B4 | 12/2010 |
| DE | 102010013068 A1 | 9/2011 |
| DE | 102009037185 A1 | 12/2012 |
| WO | 2006010355 A2 | 2/2006 |
| WO | 2006024278 A1 | 3/2006 |
| WO | 2009104148 A1 | 8/2009 |
| WO | 2009134211 A1 | 11/2009 |
| WO | 2010075836 A2 | 7/2010 |
| WO | 2010136537 A1 | 12/2010 |

* cited by examiner

ORGANIC LIGHT-EMITTING COMPONENT AND METHOD FOR PRODUCING AN ORGANIC LIGHT-EMITTING COMPONENT

This patent application is a national phase filing under section 371 of PCT/EP2013/058759, filed Apr. 26, 2013, which claims the priority of German patent application 10 2012 207 151.2, filed Apr. 30, 2012, each of which is incorporated herein by reference in its entirety.

TECHNICAL FIELD

The invention relates to an organic light-emitting component comprising an organic coupling-out layer and to a method for producing an organic light-emitting component comprising an organic coupling-out layer.

BACKGROUND

In organic light-emitting components, in particular in organic light-emitting diodes (OLEDs), the generated radiation is only proportionally coupled out directly. By way of example, waveguiding effects of a transparent substrate arranged in the beam path of the component (so-called external modes), waveguiding effects in the organic layers and a translucent electrode (so-called internal modes), absorption losses on account of materials through which generated radiation passes, and the formation of surface plasmons, in particular at a metallic electrode, for example, the cathode, as loss channels can lead to light losses. Without technical assistance, such light cannot be coupled out from the OLED.

Hitherto, in order to increase the coupling-out of light, by way of example, films having surface structures have been applied to the outer side of the substrate or the outer side has been structured in order to improve the coupling-out of external modes (so-called external coupling-out). With these measures, in particular conventional films on the outer side of the substrate, which largely consist of polymers, only a coupling-out efficiency of approximately 60 to 70% of the light guided in the substrate can be achieved, however. The light guided in the substrate corresponds to approximately 25% of the total light generated in the component. With these conventional devices, internal modes can scarcely be coupled out or cannot be coupled out at all. Furthermore, these measures adversely influence the appearance of the OLED since, as a result of the scattering, a milky or diffuse surface characterizes the appearance of the component in the switched-off state (so-called off-state appearance).

SUMMARY

At least one embodiment of the invention provides an organic light-emitting component which has an improved light coupling-out efficiency. A further embodiment of the invention provides a method for producing an organic light-emitting component having improved light coupling-out efficiency.

An organic light-emitting component is specified. According to at least one embodiment of the application, the organic light-emitting component comprises a substrate, a first electrode arranged on the substrate, and a second electrode. An organic light-generating layer stack arranged between the first and second electrodes and comprises a first organic OLED functional material. A first organic coupling-out layer is in optical contact with the organic light-generating layer stack and comprises an organic material containing a second organic OLED functional material. One of the first and second electrodes is translucent and the first organic coupling-out layer is arranged on that side of the electrode that faces away from the organic light-generating layer stack.

Hereinafter, the organic light-emitting component is also designated as "component" for short. The first and second organic OLED functional materials are also designated hereinafter as "first OLED functional material" and "second OLED functional material", respectively.

The fact that the first organic coupling-out layer is "in optical contact" with the organic light-generating layer stack means, according to the application, that there are arranged between the organic light-generating layer stack and the first organic coupling-out layer only layers and/or elements which have a refractive index that is greater than or equal to the layer-thickness-weighted average value of the refractive index of the organic light-generating layer stack. According to the application, all indications concerning refractive indices relate to a wavelength of 632 nm and a temperature of 25° C. (room temperature). The refractive index can be abbreviated to n.

The first organic coupling-out layer is arranged in a beam path of the component. According to the application, light denotes electromagnetic radiation, in particular in the visible range of the spectrum; the wavelength in this case is substantially between 400 and 800 nm.

According to the application, the term "on" is understood to mean both the direct arrangement of elements with a common interface and an indirect arrangement, in which further elements can be present between the elements arranged one on another. By way of example, further layers can be arranged between the substrate and the first electrode. In an analogous form, an element is arranged "between" a first and a second element if the element is arranged on the first element and the second element is arranged on that side of the element which faces away from the first element, wherein "on" is understood as described above.

The coupling-out of light from the component can be improved by the first organic coupling-out layer arranged in the beam path of the component. Since the layer is in optical contact with the light-generating layer stack, total reflections between the light-generating layer stack and the first organic coupling-out layer can be largely or completely avoided. Advantageously, therefore, internal modes can also be coupled out (so-called internal coupling-out), which is scarcely possible by means of conventional measures such as, for example, coupling-out or scattering films on the outer side of the substrate.

The first organic coupling-out layer can in particular have a high refractive index and have light-scattering properties. Advantageously, the generated light is scattered such that also hardly any or no total reflections or waveguiding effects at all occur in a transparent substrate possibly arranged downstream. Therefore, light losses as a result of waveguiding effects in a transparent substrate and also in the organic light-generating layer stack and a transparent electrode can be reduced or prevented by the first organic coupling-out layer. As a result, the coupling-out of light is improved in comparison with conventional components.

The high refractive index properties of the first organic coupling-out layer can be attributed to the second OLED functional material, in particular, since the latter has a high refractive index. The first and second OLED functional materials can be selected from identical or different, but in particular similar, compounds. Therefore, the first and second OLED functional materials can also have similar refractive indices.

In accordance with a further embodiment, the first and second OLED functional materials comprise the same materials. In other words, chemical compounds which belong to the same substance class, such as aromatic compounds, for example, can be used for the first and second OLED functional materials. In this case, the chemical compounds of the first and second OLED functional materials can differ by virtue of substituents. In particular, the chemical compounds of the first and second OLED functional materials do not differ, and so the latter have an identical chemical structure.

The term "organic light-generating layer stack" does not preclude the fact that the light-generating layer stack can comprise inorganic materials besides organic materials. In particular, the proportion of the inorganic materials in the layer stack is small, for example less than 10%, and so here and hereinafter reference is made to an organic light-generating layer stack.

In accordance with a further embodiment, the first organic coupling-out layer therefore has a refractive index that is greater than or equal to the layer-thickness-weighted average value of the refractive index of the organic light-generating layer stack. Likewise, the organic material of the first organic coupling-out layer can have a refractive index that is greater than or equal to the layer-thickness-weighted average value of the refractive index of the organic light-generating layer stack. This can result, in particular, from the choice of the second OLED functional material.

According to the application, an organic OLED functional material denotes an organic material such as can typically be used in one or more of the layers of a layer stack arranged between the electrodes of an OLED. Such an OLED functional material can be, for example, a charge carrier transport material, a matrix material and/or a material of a blocker layer, for example, of a unipolar charge carrier blocker layer. The second organic OLED functional material can be selected, in particular, from non-light-emitting materials. The second OLED functional material can thus be chosen from conventional functional materials of an OLED which comprise, in particular, a low molecular weight compound, so-called "small molecules". On account of its arrangement in the component, however, the second OLED functional material does not have to perform this "typical" function that is to say, for example, if it is selected from a charge carrier transport material, does not have to carry out charge carrier transport in the component. It is merely chosen from the corresponding materials having such properties. The second OLED functional material can therefore be selected from a group of materials which are suitable per se for serving as charge carrier transport materials, OLED matrix materials, materials of a blocker layer in OLEDs, without having to effect this type of use in the first organic coupling-out layer. The first organic coupling-out layer can, but need not, be electrically insulated from the translucent electrode.

The second OLED functional material differs from polymers usually used for conventional scattering films. The latter are not usually selected from materials employed in the layer stack of an OLED. Therefore, the first organic coupling-out layer according to the application is fundamentally different from polymer-based scattering films. The first organic coupling-out layer can also be free or largely free of conventional polymers. In this case, largely free means less than 5% by weight, in particular less than 2% by weight (% by weight=percent by weight).

In accordance with a further embodiment, the organic material of the first organic coupling-out layer contains at least 80% by weight, in particular at least 90% by weight, of second OLED functional material. The organic material can contain at least 95% by weight of second OLED functional material or consist completely thereof. The organic material comprises all organic constituents of the first organic coupling-out layer.

The light-generating layer stack comprises at least one organic light-emitting layer. Further organic layers, such as, for example, hole injection layers, hole transport layers, electron injection layers, electron transport layers, or additional light-emitting layers, which emit light of different wavelengths, for example, can likewise be present in the light-generating layer stack. At least one of the layers of the layer stack comprises a first OLED functional material. Different first OLED functional materials can also be present.

The light-emitting layer can furthermore comprise organic or organometallic light-emitting material which is selected from phosphorescent and/or fluorescent substances, for example. Furthermore, a matrix material can be present in the light-emitting layer, the light-emitting material being incorporated in the matrix material. Electron-deficient dopants (p-type dopants) can be present in hole transporting layers in order to increase the hole concentration and thus the conductivity. Likewise, n-type dopants can be present in electron transporting layers, the n-type dopants increasing the electron concentration.

Examples of materials having hole transporting and/or hole injecting properties are: 1-TNATA (4,4',4"-tris(N-(naphth-1-yl)-N-phenyl-amino)triphenylamine, 2-TNATA (4,4',4"-tris(N-(naphth-2-yl)-N-phenyl-amino)triphenylamine, MTDATA (4,4',4"-tris(N-3-methylphenyl-N-phenyl-amino)-triphenylamine), aNPD (N,N'-bis(naphthalen-1-yl)-N,N'-bis(phenyl)benzidine), bNPD (N,N'-bis(naphthalen-2-yl)-N,N'-bis(phenyl)benzidine), TPD (N,N'-bis(3-methylphenyl)-N,N'-bis(phenyl)benzidine), spTAD (2,2',7,7'-diphenylaminospiro-9,9'-bifluorene), Cu—PC (phthalocyanine-copper complex) or other PC-metal complexes, TAPC (1,1-bis-[(4-phenyl)-bis-(4,4',4"-methylphenyl)amino]cyclohexane) and combinations thereof.

Examples of materials having electron transporting and/or electron injecting properties are: Alq3 (tris(8-hydroxyquinoline)aluminum, BAlq2 (bis-[2-methyl-8-quinolato]-[4-phenylphenolato]-aluminum (III)), BPhen (4,7-diphenyl-1,10-phenanthroline), BCP (2,9-dimethyl-4,7-diphenyl-1,10-phenanthroline), TPBi (1,3,5-tris-(1-phenyl-1H-benzimidatol-2-yl)-benzene), TAZ (3-(4-biphenyl)-4-phenyl-5-(4-tert-butylphenyl)-1,2,4-triazole), TAZ2 (3,5-diphenyl-4-naphth-1-yl-1,2,4-triazole), t-Bu-PBD (2-(-biphenyl)-5-(4-tert-butyl-phenyl)-1,3,4-oxadiazole), triazine, triazine derivatives and combinations thereof.

Examples of suitable phosphorescent substances include the following materials or combinations of materials: FIr6, FPt1 ([2-(4',6'-difluorophenyl)-pyridinato)-acetyl acetonate]-platinum-II), FIrpic (bis(3,5-difluoro-2-(2-pyridyl)phenyl-(2-carboxypyridyl)-iridium-III), FIrN4, Irppy3 (fac-tris(2-phenyl-pyridyl)iridium complex), Ir(ppy)2acac, Ir(typ)3 (tris[2-(4-totyl)-pyridinato]-iridium(III)), Ir(typ)2acac, Ir(bt)2acac, Ir(btp)2acac (bis[2-(2'-benzothienyl-pyridinato]-[acetyl-acetonato]-iridium(III)), Ir(dbp)2acac (iridium(III)bis(dibenzo-[f,h]quinoxaline) (acetyl acetonate)), Ir(mdp)2acac (iridium(III)bis(2-methyldibenzo-[f,h]quinoxaline) (acetyl acetonate)), Ir(pq)3, Ir(pq)2acac, Ir(piq)3, (CF3ppy)2Ir(pic), PtOEP (platinum octaethyl porphyrin).

Examples of suitable fluorescent substances include the following materials or combinations of materials: DCM (4-(dicyanomethylene)-2-methyl-6-(p-dimethylamino-styryl)4H-pyrane), DCM2 (4-dicyanomethylene)-2-methyl-6-(julolidin-4-yl-vinyl)-4H-pyrane), rubrene (5,6,11,12-tetraphenyl-naphthacene), coumarin (C545T), TBSA (9,10-bis [(2",7""-di-t-butyl)-9'-9"-spirobifluorenyl]anthracene), Zn complexes, Cu complexes.

By way of example, the following materials or combinations of materials are suitable for an organic light-generating layer or as a matrix material in which fluorescent or phosphorescent substances can be incorporated: CBP (4,4'-bis (carbazol-9-yl)-2-2'-dimethyl-biphenyl), TCTA (4,4',4"-tris (n-naphth-2-yl)-N-phenyl-amino)triphenylamine), mCP, TCP (1,3,5-tris-carbazol-9-yl-benzene), CDBP (4,4'-bis(carbazol-9-yl)-2,2'-dimethyl-biphenyl), DPVBi (4,4-bis(2,2-diphenyl-ethen-1-yl)-diphenyl), spiro-PVBi (spiro-4,4'-bis(2,2-diphenyl-ethen-1-yl)-diphenyl), ADN (9,10-di(2-naphthyl)anthracene), perylene, carbazole derivatives, fluorene derivatives. These compounds, too, can serve as first OLED functional material. Examples of electron-deficient dopants (p-type dopants) are: iron chloride ($FeCl_3$), iron bromide ($FeBr_3$), antimony pentachloride ($SbCl_5$), arsenic pentachloride ($AsCl_5$), boron trifluoride ($BF_3$), tungsten oxide, molybdenum oxide, ruthenium oxide, 2,3,5,6-tetrafluoro-7,7,8,8-tetracyano-chinodimethane (F4-TCNQ), dicyanodichloroquinone (DDQ), trinitrofluorenone and combinations thereof.

Examples of n-type dopants are: cesium carbonate, lithium fluoride, lithium oxide, lithium, calcium and combinations thereof.

In accordance with a further embodiment, the substrate with the first electrode arranged thereon and/or the second electrode are embodied as transparent or translucent. According to the application, transparent or translucent means that a layer or an element is at least partly transmissive to visible light and has a relative transmission at a wavelength of 600 nm of at least 50%. The transmission at a wavelength of 600 nm can be >70% and in particular >80%.

The substrate can be embodied as stiff or flexible and can furthermore serve for stabilization and/or for better handling of the component. The substrate can comprise glass and plastics, for example. In so far as the substrate is arranged in the beam path of the light generated in the component, it is embodied as transparent. In components in which the beam path does not pass through the substrate, that is to say that emission does not take place through the substrate, the latter can also be light-nontransmissive and comprise or consist of, for example, non-transparent plastic or metal.

The material for a transparent or translucent first and/or second electrode can be a conductive transparent oxide. Transparent conductive oxides (TCO for short) are transparent conductive materials, generally metal oxides such as, for example, zinc oxide, tin oxide, cadmium oxide, titanium oxide, indium oxide or indium tin oxide (ITO). A further example is aluminum zinc oxide (AZO) or indium zinc oxide (IZO). Alongside binary metal-oxygen compounds such as, for example, ZnO, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

Furthermore, by way of example, a transparent electrode layer can also be present which consists of a thin metal layer such as, for example, aluminum, barium, indium, silver, gold, magnesium, calcium and lithium and combinations thereof or contains such a metal or such an alloy. Typical layer thicknesses of these transparent metal layers are ≤20 nm. The transparent electrode can furthermore comprise a plurality of layers arranged one above another, wherein alternately thin metal films and TCO layers are arranged one above another. One example of such a layer sequence is ITO-Ag-ITO. Further possible materials of a transparent electrode can be selected from networks comprising metallic nanowires, for example composed of silver, which can be combined with conductive polymers, networks comprising carbon nanotubes, which can be combined with conductive polymers, and comprising graphene layers and composites.

A light-nontransmissive first and/or second electrode can comprise a metal selected from a group comprising silver, aluminum, cadmium, barium, indium, magnesium, calcium, lithium or gold. Such an electrode can be embodied as multilayered and/or reflective. Typical layer thicknesses for light-nontransmissive or reflective electrodes are ≥50 nm.

The first electrode can be embodied as an anode, and the second electrode as a cathode, for example.

In accordance with a further embodiment, the first organic coupling-out layer has a refractive index of n≥1.52. The refractive index can be n≥1.56 and in particular n≥1.60. Likewise, the organic material of the first organic coupling-out layer can also have a refractive index of n≥1.52. The refractive index of the organic material can be ≥1.56 and in particular n≥1.60. A high refractive index is advantageous for efficient coupling-out. The refractive index of the first organic coupling-out layer or of the organic material is advantageously higher than the refractive index of customary polymer materials such as are used for conventional scattering films, for example.

The first organic coupling-out layer or the organic material can have, in particular, a higher refractive index than glass. Glass should be understood here to mean window glass or customary display glass. Such a glass has a refractive index of approximately 1.52. This is advantageous if the light generated in the component is intended to be emitted through a substrate or an encapsulation composed of glass or a transparent material having a similar refractive index.

In accordance with a further embodiment, the first organic coupling-out layer contains at least 60% by weight, in particular at least 70% by weight, of organic material. The first organic coupling-out layer can contain at least 80% by weight of organic material or consist completely thereof.

In accordance with a further embodiment, the second OLED functional material is selected from a group comprising Alq3 (tris(8-hydroxy-quinoline)aluminum, BAlq2 (bis-[2-methyl-8-quinolato]-[4-phenylphenolato]-aluminum (III)), BPhen (4,7-diphenyl-1,10-phenanthroline), BCP (2,9-dimethyl-4,7-diphenyl-1,10-phenanthroline), TPBi (1,3,5-tris-(1-phenyl-1H-benzimidatol-2-yl)-benzene), TAZ (3,(4-biphenyl)-4-phenyl-5-(4-tert-butylphenyl)-1,2,4-triazole), TAZ2 (3,5-diphenyl-4-naphth-1-yl-1,2,4-triazole), t-Bu-PBD (2-(-biphenyl)-5-(4-tert-butyl-phenyl)-1,3,4-oxadiazole), 1-TNATA (4,4',4"-tris(N-naphth-1-yl)-N-phenyl-amino)triphenylamine, 2-TNATA (4,4',4"-tris(N-(naphth-2-yl)-N-phenyl-amino)triphenylamine, MTDATA (4,4',4"-tris (N-3-methylphenyl-N-phenyl-amino)triphenylamine),
aNPD (N,N'-bis(naphthalen-1-yl)-N,N'-bis(phenyl)benzidine), bNPD (N,N'-bis(naphthalen-2-yl)-N,N'-bis(phenyl) benzidine), TPD (N,N'-bis(3-methylphenyl)-N,N'-bis(phenyl)benzidine), spTAD (2,2',7,7'-diphenylamino-spiro-9,9'-bifluorene), TAPC (1,1-bis-[(4-phenyl-)-bis-(4',4"-methylphenyl)-amino]-cyclohexane), CBP (4,4'-bis(carbazol-9-yl)-

2-2'dimethyl-biphenyl), TCTA (4,4',4"-tris(n-(naphth-2-yl)-N-phenyl-amino)triphenylamine), TCP (1,3,5-tris-carbazol-9-yl-benzene), CDBP (4,4'-bis(carbazol-9-yl)-2,2'-dimethyl-biphenyl), DPVBi (4,4-bis(2,2-diphenyl-ethen-1-yl)-diphenyl), spiro-PVBi (spiro-4,4'-bis(2,2-diphenyl-ethen-1-yl)-diphenyl), ADN (9,10-di(2-naphthyl)anthracene), perylene, oligomers of these compounds or combinations thereof. At least some of these compounds can also be contained in the organic light-generating layer stack, for example as first OLED functional material. Consequently, by means of the choice of the second OLED functional material, it is possible to obtain a refractive index for the first organic coupling-out layer that is greater than or equal to the layer-thickness-weighted average value of the refractive index of the organic light-generating layer stack.

In accordance with a further embodiment, the second OLED functional material is selected from a group comprising Alq3 (tris(8-hydroxyquinoline)aluminum, BPhen (4,7-diphenyl-1,10-phenanthroline), BCP (2,9-dimethyl-4,7-diphenyl-1,10-phenanthroline), aNPD (N,N'-bis(naphtha-len-1-yl)-N,N'-bis(phenyl)benzidine), oligomers of these compounds or combinations thereof.

According to the application, oligomers are understood to mean compounds which contain fewer than 50 monomeric units of the abovementioned compounds for the second OLED functional material. The oligomers can contain fewer than 30, in particular fewer than 15, of such monomeric units. In the oligomers, the monomeric units are bonded to one another by covalent bonds. An organic material of the first organic coupling-out layer which contains such oligomers can be applied via a liquid phase, for example. The oligomers can also contain only up to five of such monomeric units, such that they can still be applied via the gas phase, for example by vapor deposition.

In accordance with a further embodiment, the second OLED functional material has a molar mass of at most 2000 g/mol, in particular at most 1500 g/mol. The molar mass can be at most 1000 g/mol. The second OLED functional material then corresponds to low molecular weight organic compounds (small molecules). An organic material which comprises or consists of such a second OLED functional material can be applied, for example, by thermal evaporation in vacuo or by similar methods. The second OLED functional material need not comprise oligomers, rather oligomers can also be dispensed with. The second OLED functional material can therefore be chosen from the abovementioned compounds without the corresponding oligomers.

In accordance with a further embodiment, the first organic coupling-out layer has scattering structures on the side facing away from the organic light-generating layer stack. The scattering structures can be selected, for example, from lens-shaped, pyramidal, prismatic, parallelepipedal, truncated-pyramid-shaped, conical, truncated-cone-shaped structures and combinations thereof. The scattering structures can be arranged close together and/or comprise non-periodic structures. The scattering structures improve the scattering properties of the first organic coupling-out layer. In this case, in particular, reflections at the exit surface of the light from the first organic coupling-out layer are reduced.

In accordance with a further embodiment, the first organic coupling-out layer contains scattering particles. The scattering particles can be embedded into the organic material of the first organic coupling-out layer and can be distributed, for example, homogeneously in the entire first organic coupling-out layer. Particles composed of a material having a different refractive index than the organic material of the first organic coupling-out layer are suitable, in principle. The scattering particles can be formed, for example, from acrylates, air inclusions, silicones or silicon dioxide. Furthermore, the scattering particles can comprise or consist of $TiO_2$, $ZrO_2$, tantalum oxide or $Al_2O_3$. The difference $\Delta n$ in refractive index between the scattering particles and the organic material that can serve as a matrix for the scattering particles can be $\Delta n \geq 0.1$. In this embodiment, the scattering properties of the first organic coupling-out layer can substantially be produced by the scattering particles. The first organic coupling-out layer can also consist of the organic material and the scattering particles.

In accordance with a further embodiment, the scattering particles have an average diameter of 100 nm to 5 µm, in particular of 300 nm to 1.5 µm. According to the application, the average diameter of particles is determined by means of a screening method.

In accordance with a further embodiment, the first organic coupling-out layer contains up to 35% by weight of scattering particles. The first organic coupling-out layer can contain up to 20% by weight, in particular up to 10% by weight, of scattering particles. Such a content enables an effective scattering effect.

In accordance with a further embodiment, the first organic coupling-out layer has a thickness selected from a range comprising 100 nm to 500 µm, in particular 100 nm to 200 µm. This range also includes possible scattering structures, such that the first organic coupling-out layer can also have a smaller layer thickness in places, for example, between the scattering structures.

In accordance with one development of this embodiment, the first organic coupling-out layer has a layer thickness of 100 nm to 5 µm. Such a layer thickness can be chosen in particular for a first organic coupling-out layer which has scattering structures and contains hardly any or no scattering particles at all. The layer thickness can be in the range of the size of the scattering structures.

In accordance with an alternative development of this embodiment, the first organic coupling-out layer has a layer thickness of 2 µm to 500 µm, in particular 2 µm to 200 µm. Such a layer thickness can be chosen in particular for embodiments which contain scattering particles, such that a plurality of scattering particles can also be arranged one behind another in the beam path. The scattering thus takes place across the volume of the coupling-out layer.

In accordance with a further embodiment, the first organic coupling-out layer is arranged between the first electrode and the substrate or on that side of the second electrode which faces away from the substrate. Therefore, the first organic coupling-out layer is suitable for components in which a beam path passes through the substrate and the first electrode and/or through the second electrode. Examples of such components are OLEDs embodied as so-called bottom emitters or top emitters.

In accordance with a further embodiment, the first organic coupling-out layer is arranged between the first electrode and the substrate. In this case, the first organic coupling-out layer can also be arranged directly on the first electrode and/or the substrate, that is to say have common interfaces with the substrate and/or the first electrode. The substrate and the first electrode are therefore embodied as transparent or translucent. In this case, the second electrode can be light-nontransmissive or reflective.

In this arrangement, inter alia light losses which occur as a result of waveguiding effects in the organic light-generating layer stack and the translucent first electrode and in the substrate are minimized since total reflections at an interface with the substrate are reduced or wholly avoided as a result of the scattering at the first organic coupling-out layer. Furthermore, a high refractive index of the first organic coupling-out layer can facilitate the coupling of light into the first organic coupling-out layer, such that light losses which occur as a result of waveguiding effects in the organic layers and the translucent electrode are also reduced (internal coupling-out). Overall, therefore, a significantly improved coupling-out of light is obtained in comparison with conventional components in which a so-called scattering film is arranged on that side of the substrate which faces away from the light-generating layer stack (external coupling-out).

The total coupling-out of light for the component can be increased by the first organic coupling-out layer, for example, by up to 50% in comparison with a component having a conventional scattering film.

Furthermore, in the case of this arrangement, the first organic coupling-out layer is protected against harmful environmental influences such as moisture or oxidizing gases, for example, atmospheric oxygen, by the substrate. Advantageously, therefore, discolorations, cloudiness or other aging phenomena of the first organic coupling-out layer can be largely avoided. In contrast thereto, in a conventional component, a scattering film on the outer side of the substrate is exposed to these harmful environmental influences, such that efficiency and light quality can possibly decrease even after a short operating time of the component. Furthermore, mechanical stresses can lead to the delamination of a conventional scattering film, whereas in a component according to the application, comprising a first organic coupling-out layer between first electrode and substrate, the coupling-out layer is also protected against mechanical stress and delamination.

The fact that the first organic coupling-out layer is arranged between the first electrode and the substrate prevents the outer surface of the substrate, the outer surface being visible to an observer, from having a milky or diffuse appearance in the switched-off state of the component. As a result, an advantageous esthetic impression is obtained in comparison with conventional components in which a scattering film or scattering structures is/are present on the outer side of the substrate. The outer side of the substrate can be smooth or unstructured in the component. It is thus possible to obtain a component which has both improved coupling-out of light and a higher-quality appearance than conventional components. Despite the improved coupling-out of light by means of the first organic coupling-out layer, a smooth, lustrous surface of a transparent substrate can be offered to an external observer, as a result of which the appearance of the component becomes more attractive to the external observer.

In accordance with a further embodiment, the substrate is structured on the side facing the first organic coupling-out layer. These structures can correspond to the negative scattering structures of the first organic coupling-out layer. That is to say that the scattering structures are arranged in the structures of the substrate. This can be realized, for example, by a roughened or structured substrate being provided and then the first organic coupling-out layer being applied thereto.

In accordance with a further embodiment, the first organic coupling-out layer is arranged on that side of the second electrode which faces away from the substrate. The first organic coupling-out layer can also be arranged directly on the second electrode. In this embodiment, the second electrode is embodied as transparent. The substrate and/or first electrode can then be embodied as light-nontransmissive. One example of such a component is a so-called "top emitter" OLED, in which the coupling-out of light is improved by means of the first organic coupling-out layer.

In accordance with a further embodiment, the component comprises a second organic coupling-out layer, which is in optical contact with the organic light-generating layer stack and which comprises an organic material containing a second OLED functional material. In terms of its properties such as, for example, composition, used second OLED functional material, structure, thickness and refractive index, the second organic coupling-out layer can correspond to any embodiment according to the application of the first organic coupling-out layer. In a component, the first and second organic coupling-out layers can have identical or different properties. The second organic coupling-out layer is preferably arranged on that side of the light-generating layer stack which faces away from the first organic coupling-out layer in the beam path of the component. One example of such a component would be a transparent OLED.

In accordance with one development of this embodiment, the first organic coupling-out layer is arranged between the first electrode and the substrate and the second organic coupling-out layer is arranged on that side of the second electrode which faces away from the substrate.

In accordance with a further embodiment, at least one further layer selected from a group comprising barrier layers and planarization layers is arranged between substrate and first electrode. These layers can be arranged, in particular, between the first electrode and the first organic coupling-out layer.

A planarization layer arranged on a side of the first electrode facing the first organic coupling-out layer can have a refractive index that is greater than or equal to the first organic coupling-out layer. Consequently, it does not reduce the function of the first organic coupling-out layer and can simultaneously planarize the surface of the first organic coupling-out layer. Materials of a planarization layer can be selected from the materials of the first organic coupling-out layer or from polymers, wherein preferably no scattering particles are added to the planarization layer. Examples of such polymers are polyurethanes, polycarbonates, polyimides, polyolefins, polyesters, polyethersulfone, polyvinyl chloride, polystyrene, ethylene-vinyl acetate copolymers, fluoropolymers, polyamides and combinations thereof. A planarization layer can contain additives for protection against UV radiation. The additives can comprise, for example, particles which contain or consist of $TiO_2$, $ZrO_2$ or ZnO. The diameter of such particles can be ≤50 nm, such that hardly any or no visible light at all is scattered by the particles.

In addition or as an alternative to the planarization layer, a barrier layer can be arranged on the first organic coupling-out layer. The barrier layer prevents water and/or oxygen from penetrating to the light-generating layer stack. A barrier layer can comprise a material selected from a group comprising oxides, nitrides, oxynitrides, silicon oxides, silicon nitrides and/or silicon oxynitrides, for example, aluminum oxide, zinc oxide, zirconium dioxide, titanium dioxide, tantalum oxide, hafnium dioxide and lanthanum oxide. The barrier layer can be applied, for example, by means of an atomic layer deposition method (ALD) or by means of plasma enhanced chemical vapor deposition (PE-CVD).

In accordance with a further embodiment, a barrier layer is arranged on that side of the light-generating layer stack which faces away from the substrate. The barrier layer can protect the light-generating layer stack against oxygen and/or water by preventing or reducing the penetration thereof into the light-generating layer stack. If a first or second organic coupling-out layer is likewise arranged on this side of the light-generating layer stack, the barrier layer is arranged between the first or second organic coupling-out layer and the light-generating layer stack.

In accordance with a further embodiment, the component is enveloped with a cover layer or an encapsulation arranged on the substrate.

In accordance with a further embodiment, the first organic coupling-out layer can contain additives for UV protection. The additives for UV protection can be chosen from camphor, salicylic acid, zinnamic acid and inorganic nanoparticles which can contain or consist of $TiO_2$, $ZrO_2$ or ZnO. In this case, the nanoparticles can have a diameter of ≤50 nm, such that hardly any or no visible light at all is scattered at them. According to the application, therefore, they are not regarded as belonging to the scattering particles. The additives can constitute up to 10% by weight, in particular up to 5% by weight of the first organic coupling-out layer. Advantageously, therefore, the first organic coupling-out layer can also protect the component or the organic layers of the layer stack against UV radiation, such that further measures for UV protection of the component can be dispensed with.

Furthermore, the first organic coupling-out layer can contain typical additives, for example, adhesion promoters, which are known per se to the person skilled in the art.

Furthermore, a method for producing an organic light-emitting component is specified. According to at least one embodiment, the method comprises the following method steps:

A) providing a substrate,
B) producing a layer sequence, comprising a first electrode, a second electrode and an organic light-generating layer stack, which is arranged between the first and second electrodes and comprises a first organic OLED functional material,
wherein at least one of the first and second electrodes is translucent;
C) producing a first organic coupling-out layer, such that the latter is arranged on that side of the translucent electrode which faces away from the organic light-generating layer stack, and is in optical contact with the organic light-generating layer stack; wherein the first organic coupling-out layer comprises an organic material containing a second organic OLED functional material.

The component produced by the method can be a component according to at least one of the embodiments described. All layers and elements of the component produced by a method according to the application can correspond to the corresponding layers and elements according to at least one embodiment of a component according to the application. The same correspondingly applies to the properties resulting therefrom.

The order of the method steps can, but need not, be carried out in the order indicated here. Hereinafter, a method step can also be designated as "step" for short. The method steps can in each case also comprise substeps. It is possible, for example, firstly to provide a substrate, to produce a first organic coupling-out layer and then to produce a layer sequence comprising a first electrode, a second electrode and an organic light-generating layer stack (that is to say A), C) and then B)). By way of example, it is also possible to produce a first organic coupling-out layer on a previously produced layer sequence comprising first and second electrodes and an organic light-generating layer stack and then to apply a substrate provided (that is to say B), C) and then A)).

Methods already known to the person skilled in the art can be used for method steps A) and B).

For producing the first organic coupling-out layer in step C), by way of example, a solution or a suspension containing the second OLED functional material and, if appropriate, scattering particles can be applied. This can be done by spin coating, for example. The first organic coupling-out layer then forms after removal of the solvent. The solvent can be removed at reduced pressure and/or elevated temperatures. This method is used primarily for producing a first organic coupling-out layer which contains scattering particles, since a particularly homogeneous distribution of the scattering particles in the first organic coupling-out layer is made possible as a result.

Suitable solvents for applying the first organic coupling-out layer can be selected from a group comprising isopropanol, ethanol, mesitylene, phenetole, anisole, toluene, glycol ether, ethylmethylketone, chlorobenzene, diethylether, ethylacetate, butyro-1,4-lactone, and N-methyl-2-pyrrolidone.

Further methods for applying the first organic coupling-out layer are vacuum deposition or vapor deposition. They also include thermal evaporation in vacuo. Advantageously, therefore, the first organic coupling-out layer can be produced by the same methods as one or more layers of the light-generating layer stack. As already mentioned above, it is also possible to use identical or similar OLED functional materials, such that numerous synergistic effects can be utilized in the method according to the application, which effects simplify the method and thus lower the production costs for the component.

In accordance with a further embodiment of the method, in a method step C1), scattering structures are formed on that side of the first organic coupling-out layer which faces away from the organic light-generating layer stack. Step C1) can be carried out during and/or after step C).

In accordance with one development of this embodiment, the scattering structures of the first organic coupling-out layer are produced in this case by etching or by embossing, for example, using a roller or a stamp. For this purpose, firstly in step C) the first organic coupling-out layer can be produced, for example, on the first or second electrode and then step C1) can be carried out.

In accordance with an alternative development of this embodiment, a substrate which is structured on one side is provided and the first organic coupling-out layer is produced on the side, such that scattering structures are formed. As a result, the scattering structures of the first organic coupling-out layer can be produced with an accurate fit in the structures of the substrate, such that very efficient coupling-out of light is made possible in the finished component. For this purpose, the substrate can be structured or roughened by conventional methods.

In accordance with a further embodiment, in a method step C2), a second organic coupling-out layer is produced, which is in optical contact with the organic light-generating layer stack and comprises an organic material containing a second OLED functional material. The methods and materials already mentioned can be used for this purpose. Steps C) and C2) can be carried out in any desired order or simultaneously. The first organic coupling-out layer can be arranged in particular between substrate and first electrode and the second organic coupling-out layer can be arranged on that side of the second electrode which faces away from the organic light-generating layer stack.

Furthermore, producing further layers and/or elements such as, for example, a planarization layer, a barrier layer, a cover layer or encapsulation, etc. can be the subject matter of further method steps. Methods already known to the person skilled in the art can be used for this purpose.

Further advantages, advantageous embodiments and developments of the invention will become apparent from the embodiments described below in conjunction with the figures and examples.

BRIEF DESCRIPTION OF THE DRAWINGS

Elements that are identical, of identical type or act identically are provided with the same reference signs in the figures. The figures and the size relationships of the elements illustrated in the figures among one another should not be regarded as to scale. Rather, individual elements may be illustrated with an exaggerated size and/or schematically in order to enable better illustration and/or in order to afford a better understanding.

In the figures.

DETAILED DESCRIPTION OF ILLUSTRATIVE EMBODIMENTS

Figure 1:
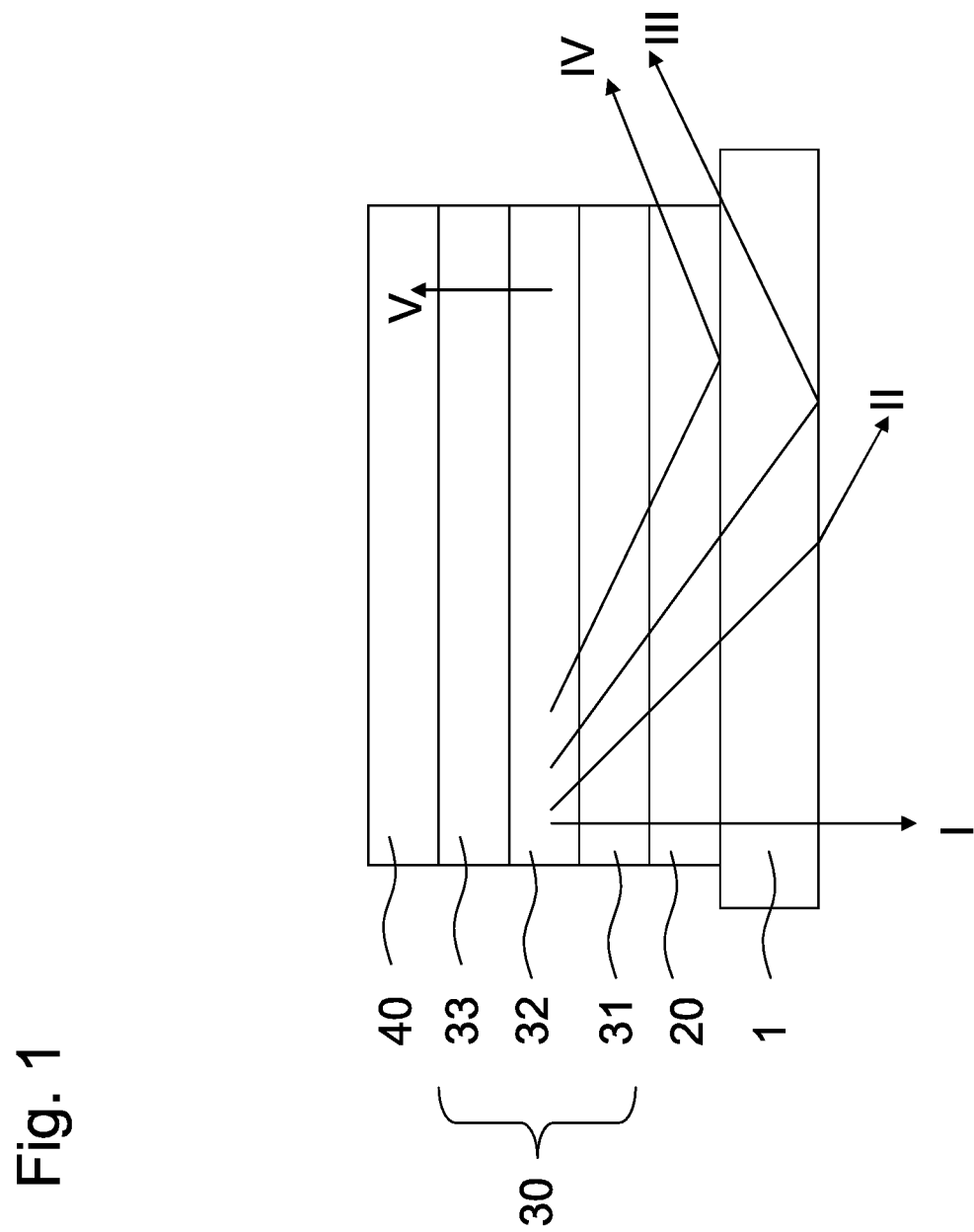
FIG. 1 shows a schematic cross section through a conventional organic light-emitting component, FIGS. 2 to 5 each show a schematic cross section through an organic light-emitting component in accordance with embodiments of the application.

FIG. 1 shows a schematic cross section through a conventional organic light-emitting component on the basis of the example of an OLED. In this case, the reference sign 1 designates the translucent substrate, which consists of glass, for example. A first electrode 20, an organic light-generating layer stack 30 and a second electrode 40 are arranged on the substrate 1. The organic light-generating layer stack 30 here comprises a light-emitting layer 32, a first charge carrier transport layer 31 and a second charge carrier transport layer 33. Further organic layers, such as, for example, charge carrier injection layers or charge carrier blocking layers, can also be present in the layer stack 30 (not shown here). The first electrode 20 is embodied as translucent, such that generated light can be emitted through the electrode and through the substrate 1. This emission is illustrated schematically by the arrow II. The first electrode 20 can be an anode, for example.

Such an OLED has various loss channels through which light generated in the light-emitting layer 32 is lost to an external observer. These possible loss channels are illustrated schematically by the arrows I, III, IV and V in FIG. 1.

Waveguiding effects of the transparent substrate 1 arranged in the beam path of the emitted light are identified by the arrow III, waveguiding effects in the organic light-generating layer stack 30 and the transparent electrode 20 are identified by the arrow IV, absorption losses on account of materials of the layer stack 30 or of the substrate 1 are identified by the arrow I, and the formation of surface plasmons, in particular at a metallic electrode, for example, the cathode 40, are identified by the arrow V.

Organic light-emitting components of embodiments according to the application can reduce in particular the losses via loss channels III and IV.

Figure 2:
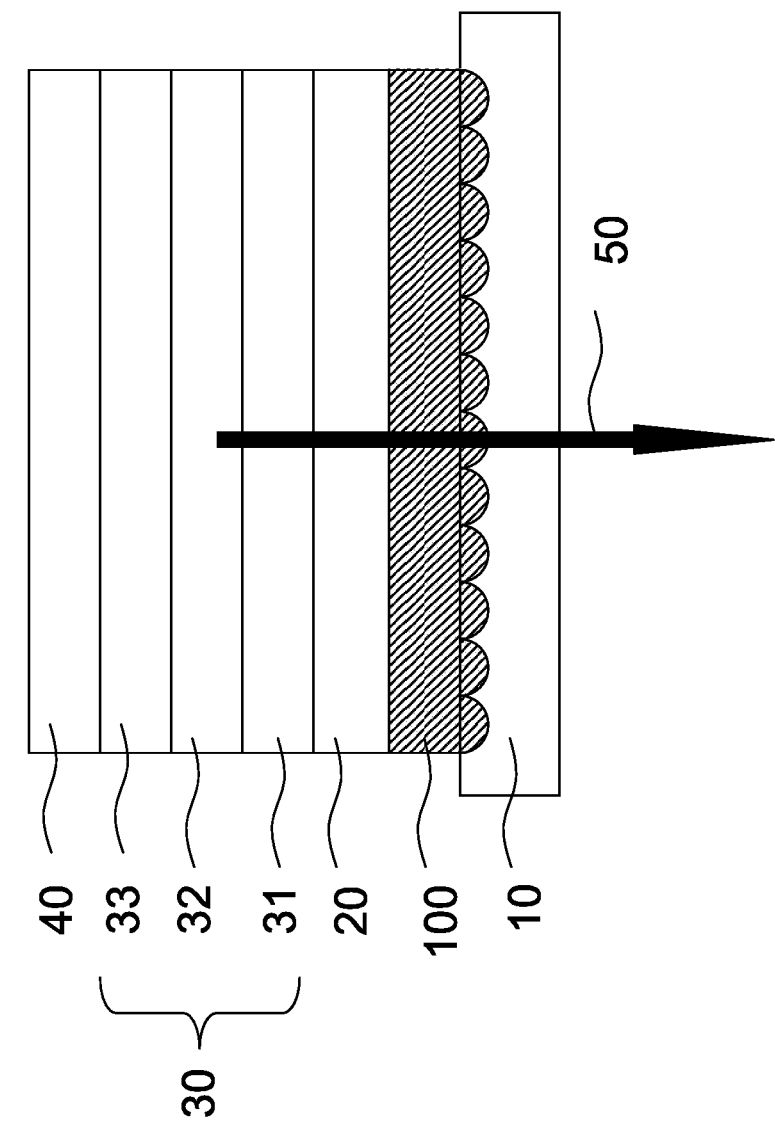

FIG. 2 shows a schematic cross section through an organic light-emitting component in accordance with at least one embodiment on the basis of the example of an OLED (bottom emitter). The latter comprises a transparent substrate 10, a translucent first electrode 20, an organic light-generating layer stack 30, and a second electrode 40. The substrate 10 can be produced from glass or plastic, for example.

The first electrode 20 can comprise or consist of a TCO, for example. The first electrode 20 can preferably be embodied as an anode. The second electrode 40 here is embodied as light-nontransmissive or reflective, and can consist of metal, for example, and form the cathode. The organic light-generating layer stack 30 here comprises a light-emitting layer 32, a first charge carrier transport layer 31 and a second charge carrier transport layer 33. Further organic layers such as, for example, charge carrier injection layers or charge carrier blocking layers can also be present in the layer stack 30 (not shown here). At least one of the layers of the organic light-generating layer stack 30 contains a first organic OLED functional material. A beam path of the light generated in the organic light-generating layer stack 30 is illustrated here in a representative manner as arrow 50.

A first organic coupling-out layer 100 according to at least one embodiment is arranged in optical contact with the organic light-generating layer stack 30. The organic coupling-out layer comprises an organic material containing a second organic OLED functional material. The first organic coupling-out layer 100 can be electrically insulated from the first electrode 20 (not shown). Charge carrier transport can, but need not, take place in the first organic coupling-out layer 100. The refractive index of the first organic coupling-out layer 100 can be, in particular, greater than or equal to the layer-thickness-weighted average value of the refractive index of the organic light-generating layer stack 30. The first organic coupling-out layer 100 can have, for example, a refractive index of n≥1.52. The refractive index can be n≥1.56 and in particular n≥1.60. The refractive index of the first organic coupling-out layer 100 can be, in particular, greater than that of the substrate 10.

The first organic coupling-out layer 100 can contain at least 60% by weight of organic material, which can in turn contain at least 80% by weight of second OLED functional material.

As shown in FIG. 2, here the first organic coupling-out layer 100 is arranged between the first electrode 20 and the substrate 10, wherein the substrate 10 is structured on this side. The first organic coupling-out layer 100 has scattering structures, which are illustrated as lens-shaped here. The scattering structures can also be selected from pyramidal, prismatic, parallelepipedal, truncated-pyramid-shaped, conical and/or truncated-cone-shaped structures. The scattering structures here are arranged close together in order to ensure efficient coupling-out of light. The scattering structures can also comprise non-periodic structures. The first organic coupling-out layer 100 and the substrate 10 here have a common interface.

The layer thickness of the first organic coupling-out layer can be 100 nm to 500 μm. The layer thickness can be, for example, in the range of 100 nm to 5 μm. In this case, the first organic coupling-out layer 100 can contain few or no scattering particles at all. However, the first organic coupling-out layer 100 can also comprise scattering particles which are embedded in the organic material (not shown here). It can contain up to 35% by weight of scattering particles, which comprise or consist of, for example, acrylates, air inclusions, silicones, $SiO_2$, $TiO_2$, $ZrO_2$, tantalum oxide or $Al_2O_3$. Such a first organic coupling-out layer 100 can have a layer thickness of 2 μm to 500 μm, in particular 2 μm to 200 μm.

The first organic coupling-out layer 100 advantageously scatters the generated light such that it is coupled out from the component and is not or is scarcely reflected at a surface of the substrate 10 or the first electrode 20. Waveguiding effects and thus the loss channels III and IV are reduced or prevented as a result. In contrast to conventional components, internal modes can be coupled out, which leads to improved coupling-out in comparison with conventional scattering films.

Furthermore, the first organic coupling-out layer 100 is protected against mechanical stress and harmful environmental influences by the substrate 10, as a result of which the delamination thereof is avoided and the resistance to aging is increased. Moreover, the component can also have a smooth, lustrous surface of the transparent substrate, as a result of which the appearance of the component becomes more attractive to an external observer.

Figure 3:
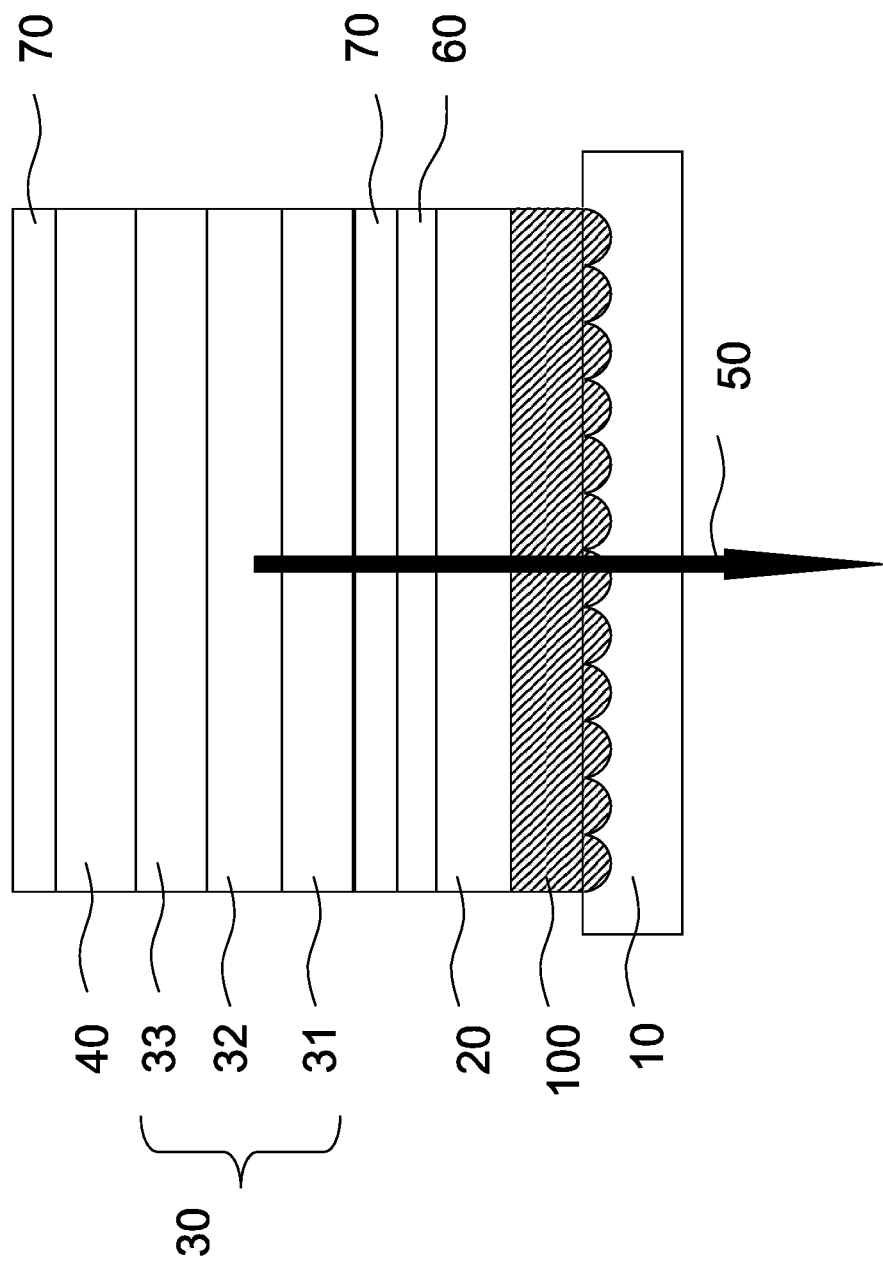

FIG. 3 shows a schematic cross section through a component in accordance with a further embodiment of the application. This component is similar to the component shown in FIG. 2. A planarization layer 60 and two barrier layers 70 are additionally present. Furthermore, the component can comprise a cover layer or an encapsulation (not shown here). Planarization layers 60, barrier layers 70 and also a cover layer or an encapsulation can, of course, also be present in the components shown in FIGS. 2, 4 and 5 (not shown there for the sake of clarity).

Figure 4:
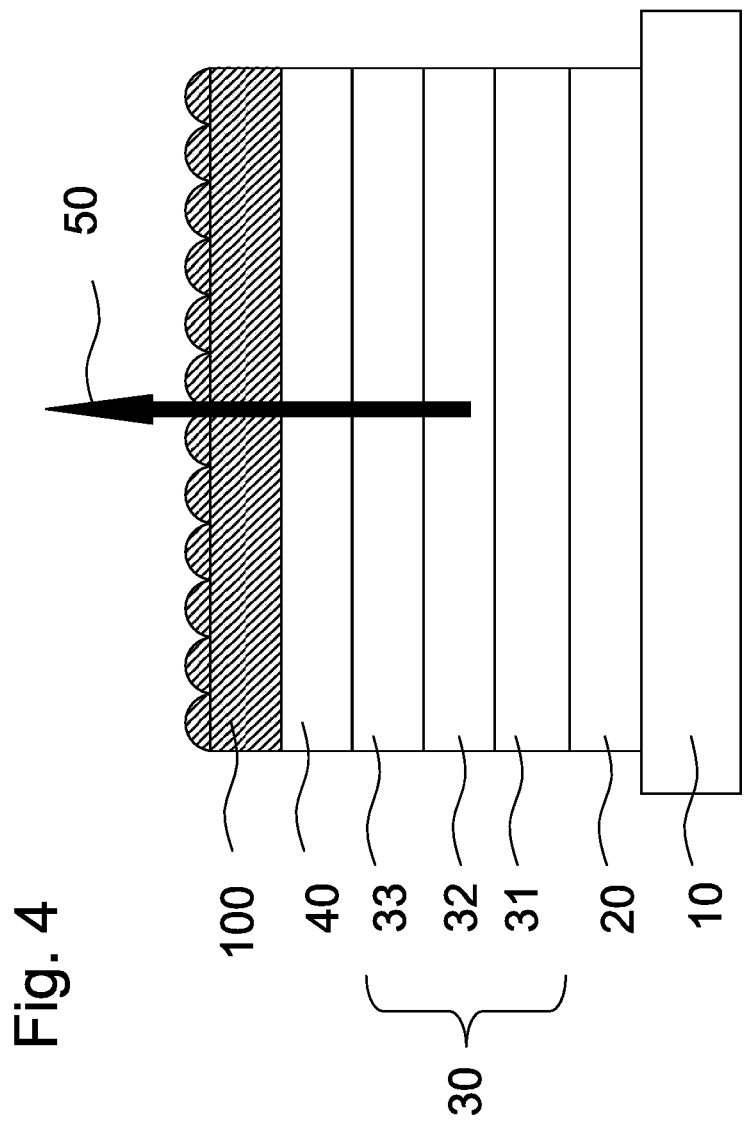

FIG. 4 shows a schematic cross section through a component in accordance with a further embodiment of the application. Here the first organic coupling-out layer 100 is produced on the translucent second electrode 40. In this component, too, the radiation is coupled out efficiently by means of the first organic coupling-out layer 100. In this exemplary embodiment, the first electrode 20 and the substrate 10 can also be embodied as light-nontransmissive. The first organic coupling-out layer can have scattering structures on the outer side and/or contain scattering particles.

Figure 5:
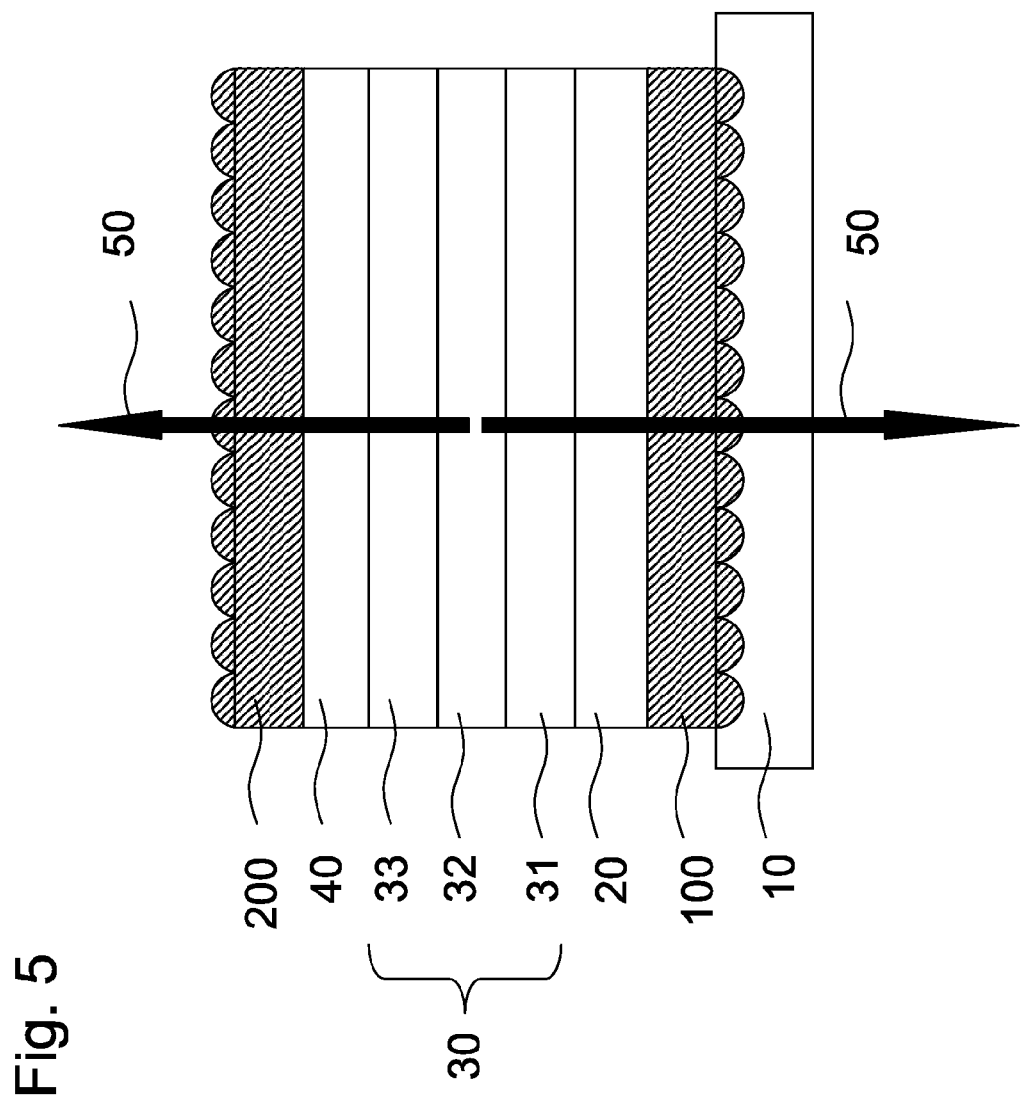

FIG. 5 shows a schematic cross section through a component in accordance with a further embodiment of the application, wherein a first organic coupling-out layer 100 is arranged between the transparent first electrode 20 and a transparent, structured substrate 10. A second organic coupling-out layer 200 is produced on the transparent second electrode 40. The first and/or second organic coupling-out layer 100, 200 can contain scattering particles and/or have scattering structures independently of one another. The component shown here can be realized as a transparent OLED, for example. In this case, efficient coupling-out of light is effected by means of the first and second organic coupling-out layers 100 and 200.

The invention is not restricted to the exemplary embodiments by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An organic light-emitting component, comprising:
a substrate;
a first electrode arranged on the substrate;
a second electrode, wherein one of the first and second electrodes is translucent;
an organic light-generating layer stack arranged between the first electrode and the second electrode, the organic light-generating layer stack configured to emit light and comprising a first organic OLED functional material;
a first organic coupling-out layer in direct contact with the substrate and the first electrode and comprising an organic material containing a second organic OLED functional material, wherein the first organic coupling-out layer is arranged in a beam path of the component, wherein the second organic OLED function material is a low molecular weight compound; and
a second organic coupling-out layer, which is in direct contact with the second electrode and which comprises an organic material containing the same second organic OLED functional material as used in the first organic coupling-out layer, wherein the second organic coupling-out layer is arranged in the beam path of the component and is a finishing layer of the component, wherein light is coupled out through the first and second organic coupling-out layers, wherein each of the first and second organic coupling-out layer comprises scattering structures on a side facing away from the organic light-generating layer stack, so that the first and second organic coupling-out layers couple out and scatter light emitted by the organic light-generating layer stack,
wherein the second organic OLED functional material comprises a material selected from the group consisting of BAlq2 (bis-[2-methyl-8-quinolato]-[4-phenylphenolato]-aluminum (III)), BCP (2,9-dimethyl-4,7-diphenyl-1,10-phenanthroline), TAZ (3,(4-biphenyl)-4-phenyl-5-(4-tert-butylphenyl)-1,2,4-triazole), TAZ2 (3,5-diphenyl-4-naphth-1-yl-1,2,4-triazole), t-Bu-PBD (2-(-biphenyl)-5-(4-tert-butyl-phenyl)-1,3,4-oxadiazole), 1-TNATA (4,4',4"-tris(N-naphth-1-yl)-N-phenyl-amino)triphenylamine, 2-TNATA (4,4',4"-tris(N-(naphth-2-yl)-N-phenyl-amino)triphenylamine, MTDATA (4,4',4"-tris(N-3-methylphenyl-N-phenylamino)triphenylamine), aNPD (N,N'-bis(naphthalen-1-yl)-N,N'-bis(phenyl)benzidine), bNPD (N,N'-bis(naphthalen-2-yl)-N,N'-bis(phenyl)benzidine), TPD (N,N'-bis(3-methylphenyl)-N,N'-bis(phenyl)benzidine), TAPC (1,1-bis-[(4-phenyl-)-bis-(4',4"-methylphenyl)-amino]-cyclohexane), CBP (4,4'-bis(carbazol-9-yl)-2-2'dimethyl-biphenyl), TCP (1,3,5-tris-carbazol-9-yl-benzene), CDBP (4,4'-bis(carbazol-9-yl)-2,2'-dimethyl-biphenyl), DPVBi (4,4-bis(2,2-diphenyl-ethen-1-yl)-diphenyl), spiro-PVBi (spiro-4,4'-bis(2,2-diphenyl-ethen-1-yl)-diphenyl), ADN (9,10-di(2-naphthyl)-anthracene), perylene, and oligomers of these compounds or combinations thereof.

2. The component according to claim 1, wherein the first organic coupling-out layer has a refractive index that is greater than or equal to a layer-thickness-weighted average value of a refractive index of the organic light-generating layer stack;
wherein the organic material of the first organic coupling-out layer contains at least 80% by weight of the second organic OLED functional material;
wherein the second organic OLED functional material has a molar mass of at most 2000 g/mol; and
wherein the first and second OLED functional materials are the same materials.

3. The component according to claim 1, wherein the first organic coupling-out layer has a refractive index that is greater than or equal to a layer-thickness-weighted average value of the refractive index of the organic light-generating layer stack.

4. The component according to claim 1, wherein the organic material of the first organic coupling-out layer contains at least 80% by weight of second organic OLED functional material.

5. The component according to claim 1, wherein the first organic coupling-out layer has a refractive index of n≥1.52.

6. The component according to claim 1, wherein the first organic coupling-out layer contains at least 60% by weight of organic material.

7. The component according to claim 1, wherein the second organic OLED functional material has a molar mass of at most 2000 g/mol.

8. The component according to claim 1, wherein the first organic coupling-out layer contains scattering particles.

9. The component according to claim 1, wherein the first organic coupling-out layer contains additives for UV protection.

10. The component according to claim 1, which comprises an encapsulation, wherein the encapsulation is arranged between the second organic coupling-out layer and the organic light-generating layer stack.

11. An organic light-emitting component, comprising:
a substrate;
a first electrode arranged on the substrate;
a second electrode;
an organic light-generating layer stack arranged between the first and second electrodes, the organic light-generating layer stack configured to emit light and comprising a first organic OLED functional material;
a first organic coupling-out layer in direct contact with the substrate and the first electrode and comprising an organic material containing a second organic OLED functional material, wherein the first organic coupling-out layer is arranged in a beam path of the component; and
a second organic coupling-out layer, which is in direct contact with the substrate and the first electrode and which comprises an organic material containing the second OLED functional material, wherein the second organic coupling-out layer is arranged in the beam path of the component and is a finishing layer of the component, wherein light is coupled out through the first and second organic coupling-out layers;
wherein the first and second OLED functional materials are the same materials;
wherein one of the first and second electrodes is translucent;
wherein the first organic coupling-out layer is arranged directly between the first electrode and the substrate, and wherein the second organic OLED functional material is a low molecular weight material;
wherein the first and second organic coupling-out layers have a refractive index of n≥1.52, which is greater than or equal to a layer-thickness-weighted average value of a refractive index of the organic light-generating layer stack;
wherein the organic material of the first organic coupling-out layer contains at least 80% by weight of the second organic OLED functional material; and
wherein the second organic OLED functional material has a molar mass of at most 2000 g/mol;
wherein the first and second organic coupling-out layers have scattering structures on a side facing away from the organic light-generating layer stack, so that the first and second organic coupling-out layers couple out and scatter light emitted by the organic light-generating layer stack; and
wherein the scattering structures are selected from lens-shaped, pyramidal, prismatic, parallelepipedal, truncated-pyramid-shaped, conical, truncated-cone-shaped structures and combinations thereof,
wherein the second organic OLED functional material comprises a material selected from the group consisting of BAlq2 (bis-[2-methyl-8-quinolato]-[4-phenylphenolato]-aluminum (III)), BCP (2,9-dimethyl-4,7-diphenyl-1,10-phenanthroline), TAZ (3,(4-biphenyl)-4-phenyl-5-(4-tert-butylphenyl)-1,2,4-triazole), TAZ2 (3,5-diphenyl-4-naphth-1-yl-1,2,4-triazole), t-Bu-PBD (2-(-biphenyl)-5-(4-tert-butyl-phenyl)-1,3,4-oxadiazole), 1-TNATA (4,4',4''-tris(N-naphth-1-yl)-N-phenyl-amino)triphenylamine, 2-TNATA (4,4',4''-tris(N-(naphth-2-yl)-N-phenyl-amino)triphenylamine, MTDATA (4,4',4''-tris(N-3-methylphenyl-N-phenylamino)triphenylamine), aNPD (N,N'-bis(naphthalen-1-yl)-N,N'-bis(phenyl)benzidine), bNPD (N,N'-bis(naphthalen-2-yl)-N,N'-bis(phenyl)benzidine), TPD (N,N'-bis(3-methylphenyl)-N,N'-bis(phenyl)benzidine), TAPC (1,1-bis-[(4-phenyl-)-bis-(4',4''-methylphenyl)-amino]-cyclohexane), CBP (4,4'-bis(carbazol-9-yl)-2-2'dimethyl-biphenyl), TCP (1,3,5-tris-carbazol-9-yl-benzene), CDBP (4,4'-bis(carbazol-9-yl)-2,2'-dimethyl-biphenyl), DPVBi (4,4-bis(2,2-diphenyl-ethen-1-yl)-diphenyl), spiro-PVBi (spiro-4,4'-bis(2,2-diphenyl-ethen-1-yl)-diphenyl), ADN (9,10-di(2-naphthyl)-anthracene), perylene, and oligomers of these compounds or combinations thereof.

* * * * *